(12) United States Patent
Dunn et al.

(10) Patent No.: US 6,617,220 B2
(45) Date of Patent: Sep. 9, 2003

(54) METHOD FOR FABRICATING AN EPITAXIAL BASE BIPOLAR TRANSISTOR WITH RAISED EXTRINSIC BASE

(75) Inventors: James Stuart Dunn, Jericho, VT (US); David L. Harame, Essex Junction, VT (US); Jeffrey Bowman Johnson, Essex Junction, VT (US); Robb Allen Johnson, S. Burlington, VT (US); Louis DeWolf Lanzerotti, Burlington, VT (US); Stephen Arthur St. Onge, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/810,856

(22) Filed: Mar. 16, 2001

(65) Prior Publication Data

US 2002/0132438 A1 Sep. 19, 2002

(51) Int. Cl.[7] ............................................. H01L 21/331
(52) U.S. Cl. ...................... 438/309; 438/321; 438/349; 438/367; 438/368
(58) Field of Search ................. 438/309, 343, 438/348, 349, 350, 365, 366, 368, 367, 321

(56) References Cited

U.S. PATENT DOCUMENTS

| | | | |
|---|---|---|---|
| 4,319,932 A | 3/1982 | Jambotkar | |
| 4,338,138 A | 7/1982 | Cavaliere et al. | |
| 4,682,409 A | 7/1987 | Thomas et al. | |
| 4,799,099 A | 1/1989 | Verret et al. | |
| 4,839,305 A | 6/1989 | Brighton | |
| 4,927,774 A | * 5/1990 | Welbourn et al. | 438/345 |
| 4,960,726 A | * 10/1990 | Lechaton et al. | 257/370 |
| 5,008,207 A | * 4/1991 | Blouse et al. | 148/DIG. 11 |
| 5,017,990 A | 5/1991 | Chen et al. | |
| 5,101,256 A | 3/1992 | Harame et al. | |
| 5,117,271 A | 5/1992 | Comfort et al. | |
| 5,162,245 A | * 11/1992 | Favreau | 438/365 |
| 5,175,607 A | * 12/1992 | Ikeda | 257/511 |
| 5,194,926 A | 3/1993 | Hayden | |
| 5,213,989 A | * 5/1993 | Fitch et al. | 438/365 |
| 5,298,786 A | 3/1994 | Shahidi et al. | |
| 5,488,002 A | * 1/1996 | Kimura et al. | 148/DIG. 10 |
| 5,523,245 A | * 6/1996 | Imai | 148/DIG. 11 |
| 5,525,818 A | 6/1996 | Hill | |
| 5,557,131 A | 9/1996 | Lee | |

(List continued on next page.)

OTHER PUBLICATIONS

Abstract of Japanese Patent No. 09069528 A, issued Mar. 11, 1995.
Abstract of Japanese Patent No. 04207038 A, issued Nov. 30, 1990.
"Lateral Bipolar Transistor With Elevated Base Contact", IBM Technical Bulletin, pp. 157–159, Nov. 1989.
"Bipolar Transistor With Pedestal Subcollector Regions Self–Aligned Underneath Field Oxide Regions", IBM Technical Disclosure Bulletin, pp. 252–253, Aug. 1988.
"Fabricating Pedestal Transistor", IBM Technical Disclosure Bulletin, pp. 179–180, Jun. 1971.

Primary Examiner—Tuan H. Nguyen
(74) Attorney, Agent, or Firm—Scully, Scott, Murphy & Presser; Anthony Canale (57) ABSTRACT

An epitaxial base bipolar transistor including an epitaxial single crystal layer on a single crystal single substrate; a raised emitter on a portion of the single crystal layer; a raised extrinsic base on a surface of the semiconductor substrate; an insulator between the raised emitter and the raised extrinsic base, wherein the insulator is a spacer; and a diffusion from the raised emitter and from the raised extrinsic base to provide an emitter diffusion and an extrinsic base diffusion in the single crystal layer, wherein the emitter diffusion has an emitter diffusion junction depth.

13 Claims, 10 Drawing Sheets

U.S. PATENT DOCUMENTS

| | | | |
|---|---|---|---|
| 5,773,350 A | * | 6/1998 | Herbert et al. ....... 148/DIG. 10 |
| 5,925,923 A | | 7/1999 | Blair |
| 6,020,246 A | | 2/2000 | Koscielniak et al. |
| 6,265,276 B1 | * | 7/2001 | Miwa ......................... 257/511 |
| 6,365,451 B2 | * | 4/2002 | Havemann .................. 438/230 |
| 6,465,317 B2 | * | 10/2002 | Marty ........................ 438/321 |
| 6,534,372 B1 | * | 3/2003 | Racanelli .................... 438/321 |

* cited by examiner

METHOD FOR FABRICATING AN EPITAXIAL BASE BIPOLAR TRANSISTOR WITH RAISED EXTRINSIC BASE

FIELD OF THE INVENTION

The present invention relates to bipolar transistors, and more particularly to an epitaxial base bipolar transistor having a raised extrinsic base and methods of fabricating the same.

BACKGROUND OF THE INVENTION

High-base resistance in bipolar transistors degrades both the minimum noise and power gain cutoff frequency. A key component of the aforesaid resistance is the extrinsic base resistance. In order to reduce the extrinsic base resistance, it is known to ion implant the base region adjacent to the emitter. Despite being capable of reducing the extrinsic base resistance, ion implantation of the base region causes transient enhanced diffusion of the implanted dopants which widens the intrinsic base, and diffuses the pedestal implant as well as the intrinsic base itself.

Additional diffusion width, which causes subsequent overlap of the implants, leads to high-capacitance devices. Moreover, this increased capacitance results in slower operating devices that have poor performance associated therewith.

Figure 1:
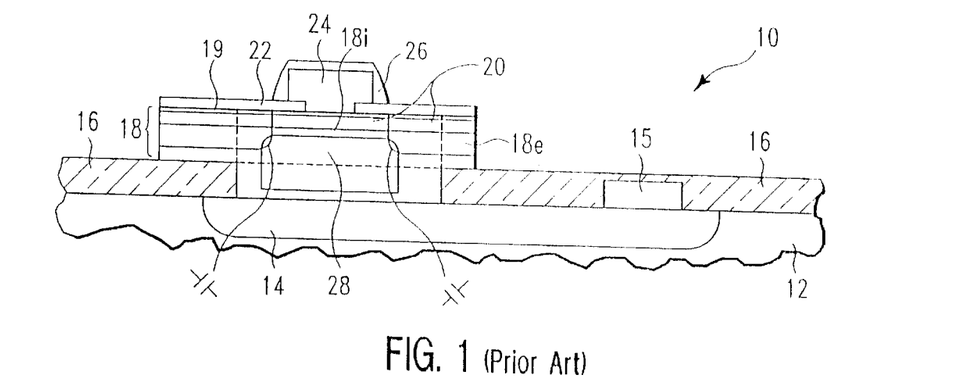
FIG. 1 is a cross-sectional view of a prior art silicon-germanium (SiGe) bipolar device having implanted extrinsic base regions.
Figure 2A:
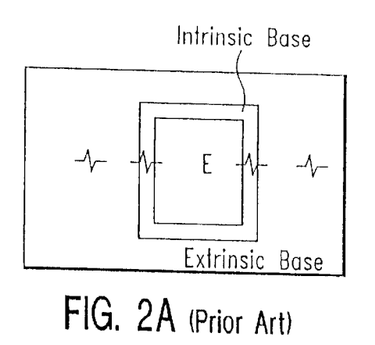
FIGS. 2A–2B are top views of an extrinsic base region of FIG. 1 with ion implantation of the extrinsic base region, FIG. 2A, and without ion implantation of the extrinsic base region, FIG. 2B.

FIGS. 1 and 2A are representative of prior art bipolar transistors in which the extrinsic base region is formed by ion implantation and activation annealing.

Specifically, FIG. 1 is a cross-sectional view through a prior art silicon germanium (SiGe) bipolar device 10 using implanted extrinsic base regions, while FIG. 2A is a top-down view of the raised portion of the device shown in FIG. 1.

Prior art bipolar device 10 of FIG. 1 comprises subcollector region (e.g., N+ doped) 14 formed in Si substrate 12 (e.g., N-type). The substrate also includes collector contact region 15 and isolation regions 16. A base region (e.g., P-type) 18 of silicon (mono-crystalline or epitaxial over the substrate, and polysilicon over the isolation regions) is located on top of the Si substrate. Base region 18 includes both intrinsic (P-doped) 18$i$ and extrinsic (N-doped) 18$e$ regions. The extrinsic base region surrounds the intrinsic region to a fixed depth below a Ge rich layer 20. In general, the polysilicon/epitaxial region, i.e., base region 18, is about 500–3000 Å thick. As stated above, within the base is a Ge rich layer of about 250–1500 Å, located 50–500 Å from the top of the base.

On top of the base region is insulator 22 having an opening exposing the top of the base region. Overlapping this opening is polysilicon emitter (N+ doped) 24. Some of the doping from the emitter region is diffused into the base region. Surrounding the emitter region are dielectric spacers 26 and a cap layer which is formed on the emitter polysilicon.

Within the silicon substrate is a pedestal region 28 (N+ doped) extending from the subcollector into the base region, but not contacting the isolation regions. The highly doped extrinsic base region of the base extends laterally to contact the pedestal. As shown, prior art implantation and subsequent activation annealing causes overlap between the pedestal and base regions.

Figure 2B:
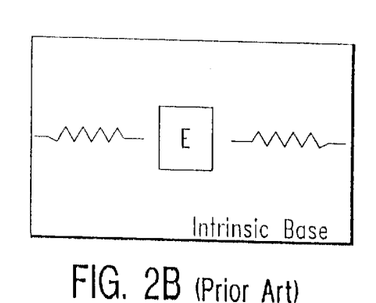

In FIG. 2A, the result of the extrinsic base region implant on resistance is shown. Note the effect of misalignment on the resistance between the emitter and the extrinsic base. This must be compared to the situation in FIG. 2B where no extrinsic base implant exists. The intrinsic portion of the base has a resistance of about 10,000 ohms/square while the extrinsic portion has a resistance of about 200 ohms/square. However, where the extrinsic base contacts or comes in proximity with the pedestal, a capacitance is associated with the PN junction. Equation (1) below shows the relationship between the important parameters:

$$f_{max} \alpha f_t/(R_B C_{CB}) \quad (I)$$

where $f_{max}$ is the maximum frequency at which there is still power gain, $f_t$ is the frequency at which the current gain goes to 1 (increases with higher pedestal doping), $R_B$ is the base resistance and is the sum of both intrinsic and extrinsic resistance, and $C_{CB}$ is the collector base capacitance (increases with higher pedestal doping).

In order to achieve higher performance and scale the device, the pedestal dose must be increased while keeping the extrinsic base resistance low. In current devices, this is a difficult problem as the ion dose increases.

In view of the above, there is thus a need to develop a new and improved method that is capable of forming a epitaxial base bipolar transistor in which both the base resistance and the device capacitance is decreased; The new method should avoid the use of ion implanting the base region since the same causes overlap of the diffused regions and increased device capacitance.

SUMMARY OF THE INVENTION

One object of the present invention is to provide an epitaxial base bipolar transistor having a low-base resistance in which the capacitance of the device is not increased.

A further object of the present invention is to provide an epitaxial base bipolar transistor having minimum noise and power gain cutoff frequency.

A still further object of the present invention is to provide an epitaxial base bipolar transistor having high-operating device performance and increased switching speeds as compared to prior art bipolar devices.

An even further object of the present invention is to provide an epitaxial base bipolar transistor wherein the emitter is self-aligned and centered to the base.

These and other objects and advantages are achieved in the present invention by utilizing a raised base structure and by providing a shallow extrinsic base profile utilizing a doped polysilicon layer as the diffusion source for the extrinsic base.

In accordance with one aspect of the present invention, methods of forming an epitaxial base bipolar transistor device having a raised extrinsic base are provided in which the base region is not doped by ion implantation.

In the first method of the present invention, the emitter region is formed prior to forming the base region. Specifically, the first method of the present invention comprises the steps of:

(a) growing at least an epitaxial single crystal layer on a single crystal semiconductor substrate;

(b) forming a raised emitter on a surface of said semiconductor substrate, said raised emitter including insulating material formed on at least sidewalls thereof;

(c) forming a raised extrinsic base on said surface of said semiconductor substrate, wherein the raised emitter and the raised extrinsic base are insulated by said insulating material; and (d) diffusing dopant from the raised emitter and said raised extrinsic base so as to provide an emitter diffusion and an extrinsic diffusion in the single crystal semiconductor substrate, wherein said emitter diffusion has an emitter diffusion junction depth, and wherein said emitter extends to said substrate surface and said base extends to said substrate surface.

In one preferred aspect of the present invention, the emitter to base surface height difference is less than 20% of the emitter junction depth.

The second method of the present invention forms the raised extrinsic base prior to formation of the emitter region. By forming the raised extrinsic base prior to emitter formation, the emitter will be self-aligned and centered to the base. Specifically, the second method of the present invention comprises the steps of:

(a) growing at least an epitaxial single crystal layer on a single crystal semiconductor substrate;

(b) forming a raised extrinsic base on said surface of said semiconductor substrate;

(c) forming a raised emitter on a surface of said semiconductor substrate, said raised emitter including insulating material formed on at least sidewalls thereof said insulating material electrically isolating said raised extrinsic base from said raised emitter; and (d) diffusing dopant from the raised emitter and said raised extrinsic base so as to provide an emitter diffusion and an extrinsic diffusion in the single crystal semiconductor substrate, wherein said emitter diffusion has an emitter diffusion junction depth, and wherein said emitter extends to said substrate surface and said base extends to said substrate surface.

In one preferred aspect of the second method of the present invention, the emitter to base surface height difference is less than 20% of the emitter junction depth.

In accordance with another aspect of the present invention, an intrinsic base bipolar transistor having a raised extrinsic base is provided. The inventive bipolar transistor comprises:

an epitaxial single crystal layer on a single crystal single substrate;

a raised emitter on the semiconductor surface;

a raised extrinsic base on the surface of the semiconductor substrate;

an insulator between the raised emitter and the raised extrinsic base, wherein said insulator is a spacer; and a diffusion from the raised emitter and from the raised extrinsic base to provide an emitter diffusion and an extrinsic base diffusion in said single crystal substrate, wherein said emitter diffusion has an emitter diffusion junction depth, said emitter extends to said substrate surface and said base extends to said substrate surface, and said emitter to base surface height difference is less than 20% of said emitter junction depth.

In one embodiment of the present invention, the emitter is self-aligned and centered to the base region.

A further aspect of the present invention is to provide a bipolar junction transistor in which the structure has resistance/capacitance control built therein. Specifically, the inventive bipolar junction transistor comprises:

a self-aligned base/emitter structure wherein a base-resistance is independently controlled by a diffusion source of variable thickness, and wherein the base-capacitance is independently variable clue to the combination of the thickness of the diffusion source and a thickness of an intrinsic-base epitaxial layer.

DETAILED DESCRIPTION OF THE INVENTION

The present invention which provides an epitaxial base bipolar transistor having a raised extrinsic base and methods of fabricating the same will now be described in more detail by referring to the drawings that accompany the present application. It is noted that like and corresponding elements are referred to by like reference numerals.

Figure 3:
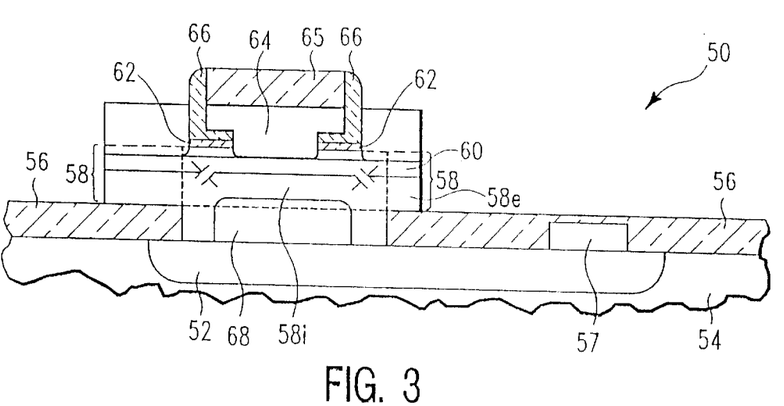
FIG. 3 is a cross-sectional view of one inventive bipolar transistor of the present invention formed by the first method of the present invention.
Figure 4:
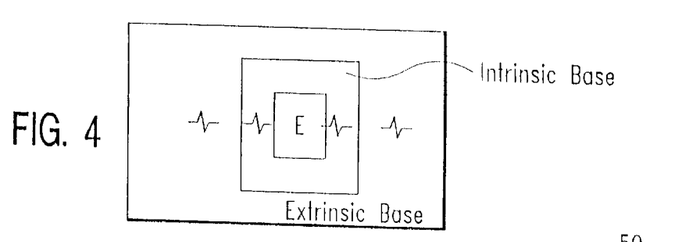
FIG. 4 is a top view over the base region of the transistor shown in FIG. 3.

Reference is first made to FIG. 3 which is a cross-sectional view illustrating one possible configuration of the inventive epitaxial base bipolar transistor that is formed utilizing the first method of the present invention. FIG. 4 shows a top-down view of the structure shown in FIG. 3. Specifically, device 50 shown in FIG. 3 comprises subcollector (e.g., N+ doped) 52 in a single crystal semiconductor substrate (e.g., N type-Si substrate) 54 containing isolation regions (e.g., shallow trench isolation regions) 56. A base region (e.g. P type) 58 of silicon (epitaxial Si over the silicon substrate, and polysilicon over the isolation regions) is located on top of the substrate surface. The base has regions for forming both intrinsic (P doped) and extrinsic (P+ doped) regions, which are labeled as 58i and 58e, respectively.

In general, the base region is about 500 to about 3000 Å thick. Within the base, is Ge rich layer 60 which has a thickness of from about 250 to about 1500 Å located about 50 to about 500 Å from the top of base 58. On top of the base region, is insulator 62 having an opening exposing the base region silicon. Overlapping this opening, is polysilicon emitter (N+ doped) region 64 which includes capping layer 65 that is made from an insulator, i.e., dielectric. Some of the doping from the emitter region is diffused into the base region. The extrinsic base region surrounds the intrinsic base region and the emitter, though it is to a fixed depth no deeper than the Ge rich layer and also surrounds most of the emitter, though it is separated from the emitter by insulator spacers 66. Within the Si substrate is pedestal region 68 (N+ doped) extending from the subcollector into the base region., but not contacting the isolation regions.

In accordance with the present invention, base region 58 is a raised base region which extends to the surface of substrate 52. Moreover, the bipolar transistor of the present invention includes a diffusion from the raised emitter and from the raised extrinsic base which provides an emitter diffusion region and an extrinsic base diffusion region in the structure. The inventive bipolar transistor is further characterized as having an emitter diffusion region which has an emitter junction depth associated therewith and the emitter extends to the surface of substrate 52. Moreover, the inventive bipolar device is also characterized as having an emitter to base surface height difference that is less than 20% of the emitter junction.

Figure 5:
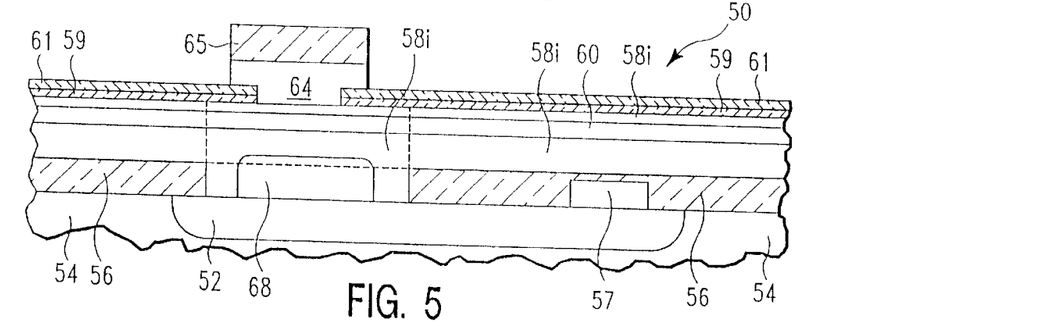
FIGS. 5–11 are pictorial representations illustrating the first method of the present invention which is employed in forming the structure shown in FIG. 3.

FIGS. 5–11 are pictorial representations through various processing steps of the first method of the present invention which are employed in forming the structure shown in FIG. 3. As stated above, the first method of the present invention forms the emitter region prior to forming the extrinsic base. Reference is first made to FIG. 5, which illustrates an initial structure 50 employed in the present invention. Specifically, the initial structure shown in FIG. 5 comprises a Si substrate 54 containing isolation regions 56, subcollector 52, subcollector contact 57 and pedestal region 68. This initial structure is fabricated utilizing conventional process techniques well known in the art; therefore a detailed description of the same is not provided herein.

A polysilicon intrinsic base layer 58i is grown epitaxially on the surface of the Si substrate using a chemical vapor deposition (CVD) process. The intrinsic base layer has a thickness of from about 500 to about 3000 Å and is intrinsically doped with a P-type dopant. The intrinsic base layer of the present invention also includes a Ge rich layer 60 which has the above mentioned thickness located therein.

After the intrinsic base layer is grown, a thin oxide layer 59 followed by a thin nitride layer 61 are formed on the grown intrinsic base layer. The oxide and nitride layers, which form a dual dielectric layer, are formed utilizing the same or different deposition process including, but not limited to: CVD, plasma-enhanced CVD, chemical solution deposition and other like deposition processes. The oxide layer has a thickness of from about 50 to about 200 Å, whereas the nitride layer has a thickness of from about 100 to about 500 Å. It is also possible in the present invention to utilize an oxide layer that is the same or different from oxide layer 59 in place of nitride layer 61.

An opening is then made in the dual dielectric layer, i.e., oxide layer 59 and nitride layer 61, utilizing conventional lithography and etching, such as reactive-ion etching (RIE), to expose the intrinsic base layer where the emitter will be subsequently formed. Next, polysilicon layer 64 is formed by conventional deposition processes such as CVD and thereafter the polysilicon layer is doped with an N-type doping utilizing a conventional ion implantation process. Layer 65 which may be composed of a nitride or oxide is then formed on top of polysilicon layer 63 utilizing a conventional deposition process and thereafter nitride layer 61 and the emitter polysilicon is etched to form the raised emitter region.

Figure 6:
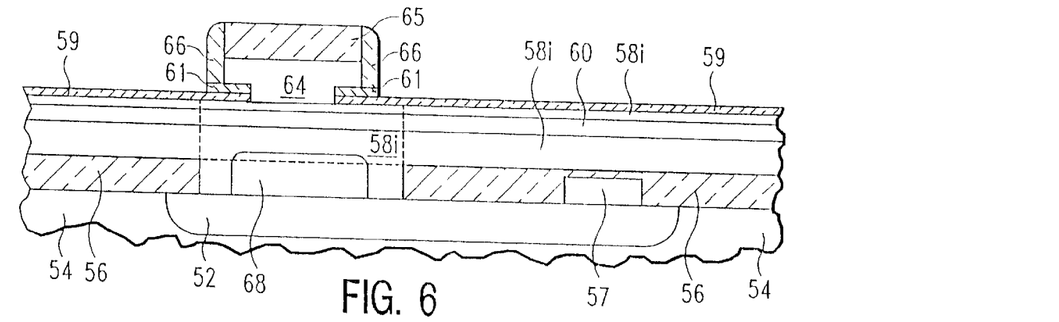

Next, sidewall spacers 66 are formed on the emitter by depositing 500–1000 Å nitride and RIE the deposited nitride with a process that is selective to oxide, See FIG. 6.

Figure 7:
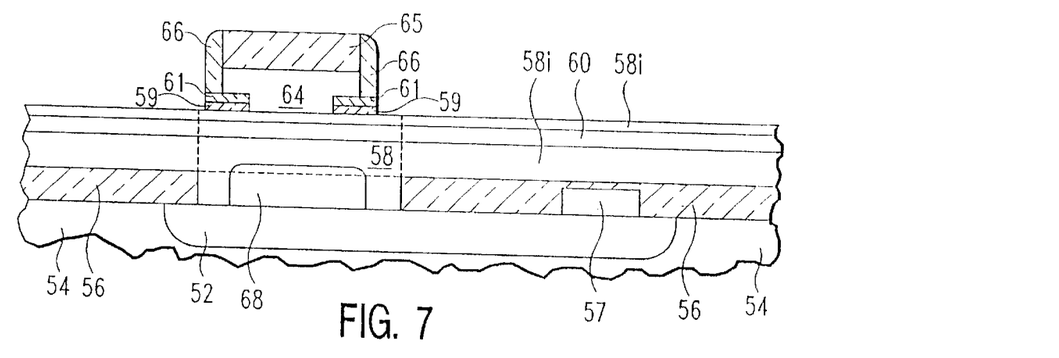
Figure 8:
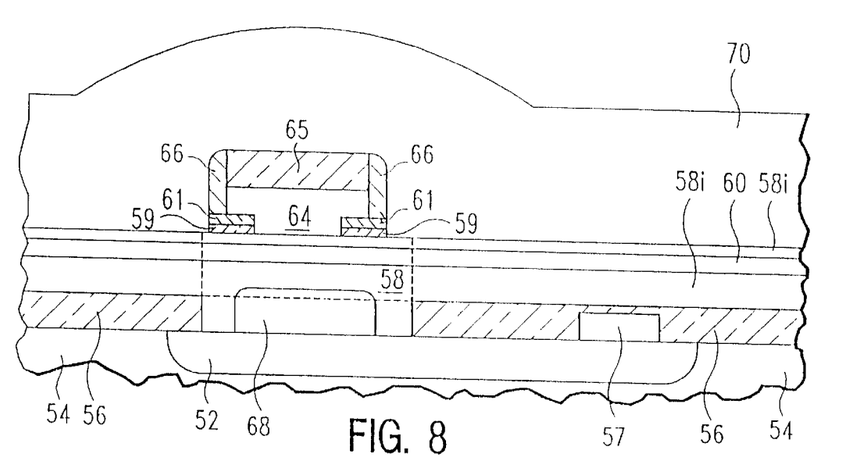

In FIG. 7, oxide layer 59 not covered by spacers 64 is removed by a conventional wet etching process. To create the raised extrinsic base region, a P+ polysilicon film 70, See FIG. 8, is deposited by conventional in-situ doping deposition processes such as CVD which are capable of depositing polysilicon at low temperatures, i.e., at temperatures of 550° C. or less. In accordance with the present invention, the P+ polysilicon has a thickness of from about 5000 to about 30,000 Å and it is highly doped having a dopant concentration on the order of $1 \times 10^{19}$ cm$^{-3}$ or above. The P+ polysilicon film used in this step of the present invention may or may not contain Ge.

It is noted that the low temperature deposition process employed in forming the P+ polysilicon film reduces dopant diffusion in the existing films; namely the SiGe base layer.

Figure 9:
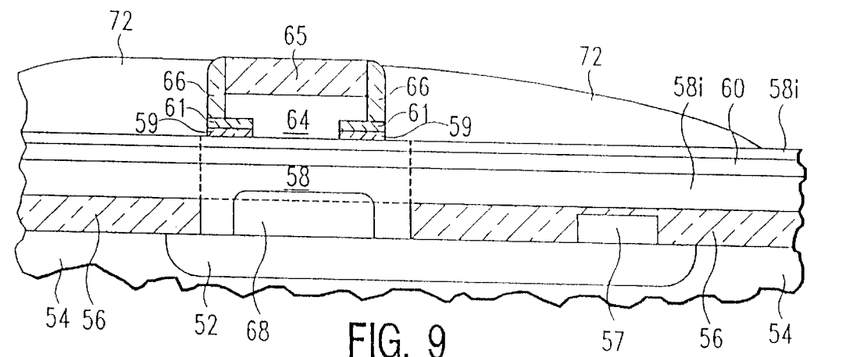

FIG. 9 shows the inventive bipolar structure after the polysilicon layer has been RIE to form polysilicon sidewalls 72 around the emitter region. It is noted that polysilicon sidewalls 72 created in this step of the present invention are used in forming the raised extrinsic base region of the inventive bipolar transistor.

Figure 10:
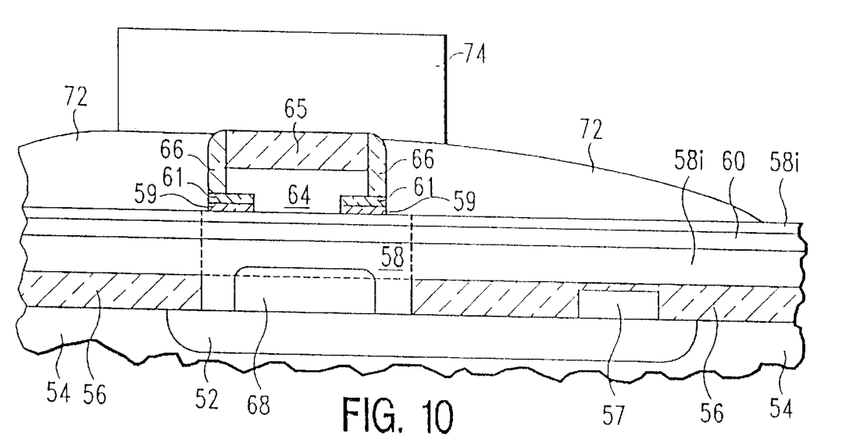

In FIG. 10, a conventional photoresist mask 74 is formed over the structure so as to define the extrinsic base region and any portion of the exposed base region is removed from the structure by utilizing a conventional etching processes well known in the art exposing the isolation regions. After this etching step, the photoresist mask is removed utilizing a conventional stripping process.

Figure 11:
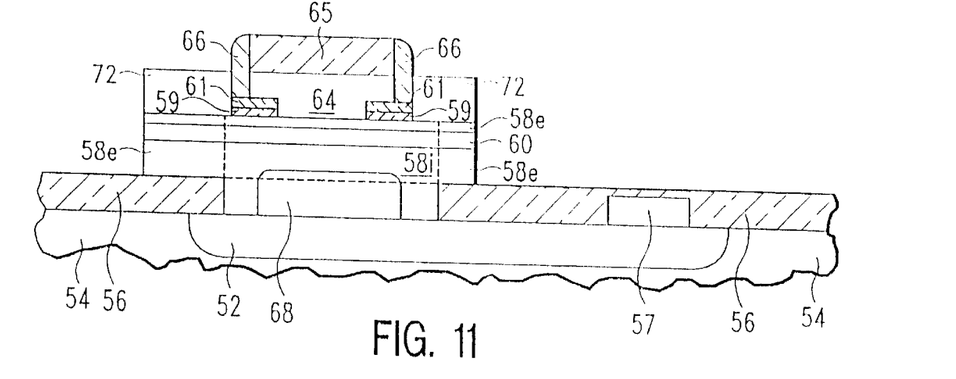

FIG. 11 show the structure after etching and subsequent removal of the photoresist mask. The structure of FIG. 11 is then subjected to a rapid thermal annealing step which is used to diffuse and activate the N+ doping of the emitter and drive it into the intrinsic base to a fixed depth to the base-emitter junction. The annealing step provides the structure shown in FIG. 3. In accordance with the present invention, the rapid thermal annealing process is carried out in an inert gas atmosphere such as $N_2$ or Ar at a temperature of greater than about 850° for a time period of less than about 30 seconds. Using the above mentioned conditions, the dopant is driven into the intrinsic base region to a depth of from about 50 to about 500 Å below the top surface of the intrinsic base region.

It is also noted that the annealing process also drives in the P+ boron dopant from the extrinsic base into the intrinsic base. The extrinsic base outdiffusion from the P+ polysilicon now contacts on the in-situ doped boron from the intrinsic base. Since ion implantation is not employed in the present invention in forming the extrinsic base region, no transient enhanced diffusion of dopants occurs; therefore decreasing the capacitance of the bipolar transistor.

Figure 12:
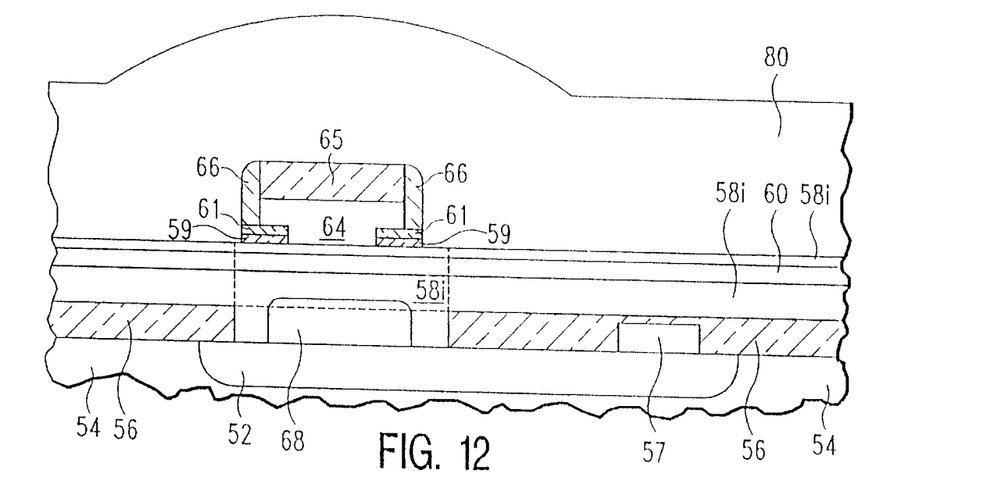
FIGS. 12–13 are pictorial representations illustrating a second embodiment of the first method of present invention.
Figure 13:
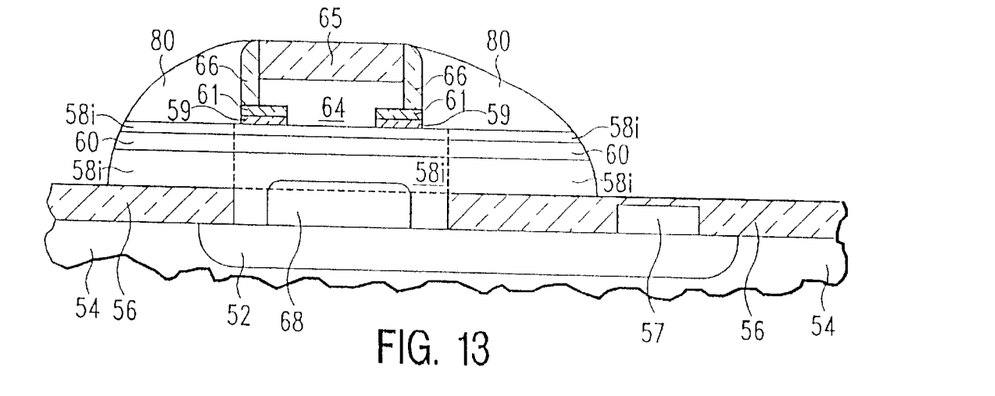

FIGS. 12–13 describe an alternative embodiment of the first method of the present invention which differs from above mentioned processing steps after the processing leading up to the structure of FIG. 8 are first performed, i.e., deposition of the extrinsic base polysilicon has been completed. A spacer RIB process is performed to form superspacer 80 shown in FIG. 13. Specifically, the superspacer is formed by first depositing a P+ polysilicon material 80 on the structure shown in FIG. 8 so as to form the structure shown in FIG. 12 and thereafter selectively etching polysilicon material and portions of the base region. This saves the additional masking step as in FIG. 10. The spacer etch is followed by a rapid thermal anneal to drive dopants down threw the emitter and base regions as described in the first embodiment.

FIGS. 14–26 are pictorial representations illustrating the second method of the present invention. As stated above, the second method of the present invention forms the extrinsic base prior to forming the emitter region. Moreover, when using the second method of the present invention, the bipolar transistor includes an emitter region that is self-aligned and centered to the base region.

Figure 14:
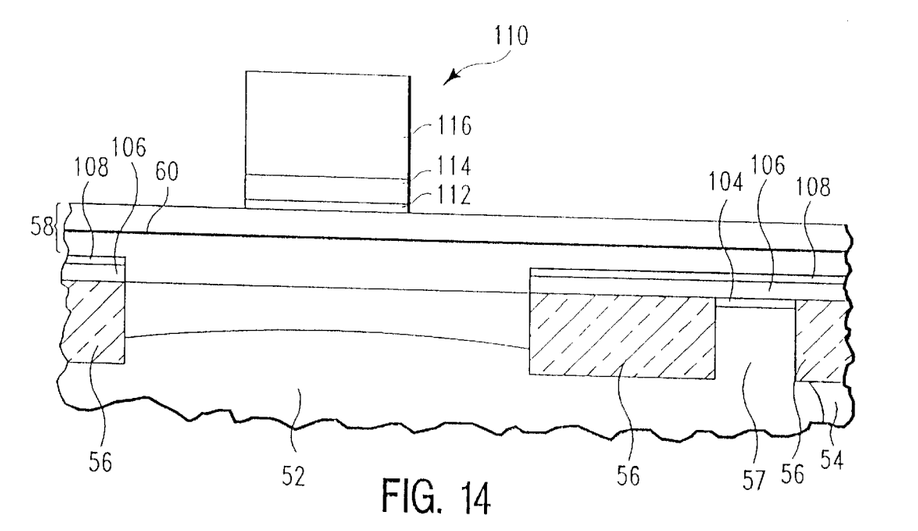
FIGS. 14–26 are pictorial representations illustrating the second method of the present invention.

Reference is first made to FIG. 14 which illustrates an initial structure employed in the second method of the present invention. Specifically, the initial structure shown in FIG. 14 includes an epitaxial/polysilicon base layer 58 containing embedded Ge rich layer 60, formed on the surface of substrate 54. The substrate includes subcollector region 52, subcollector contact 57 and isolation regions 56. In accordance to the present invention and as depicted in FIG. 14, the isolation regions are protected by oxide layer 108 and nitride layer 106. There is also a layer of oxide 104 under the nitride in the collector contact region. The structure shown in FIG. 14 is fabricated utilizing processing techniques that are well known to those skilled in the art; therefore a description concerning the same is not provided herein.

Roughly centered over the collector region is mandrel 110 formed from layers of oxide 112, silicon nitride 114, and a layer of tetraethylortosilicate (TEOS) 116, respectively. The mandrel is formed by sequentially depositing each of the above mentioned layers and thereafter the deposited mandrel layers are patterned by conventional lithography and etching. The thicknesses of the individual layers that form the mandrel may vary and are not important to the present invention.

Figure 15:
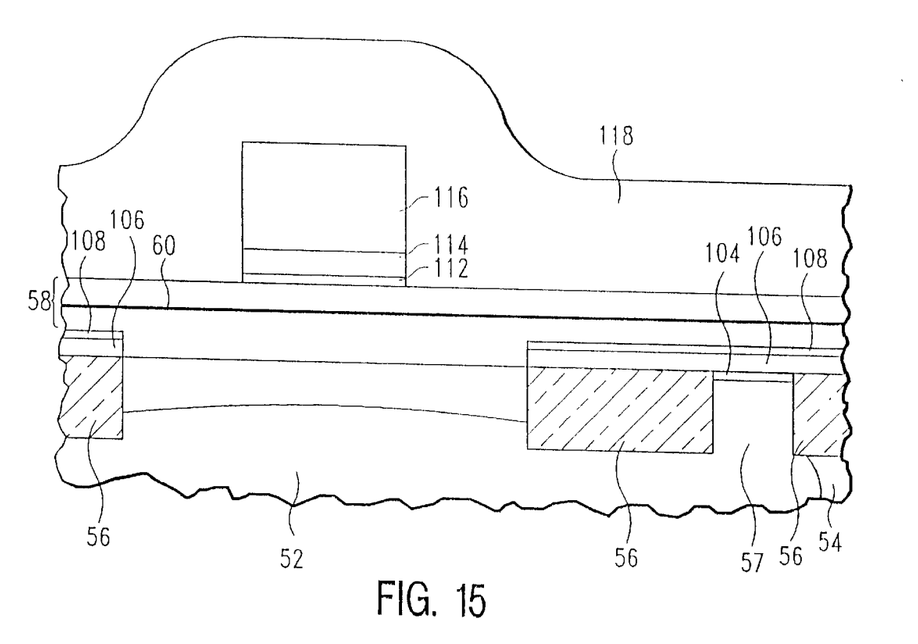

FIG. 15 shows the formation of a layer of in-situ doped P+ polysilicon 118 on the structure. This in-situ doped layer is formed by conventional processes and it typically has a thickness of at least 1000 Å.

Figure 16:
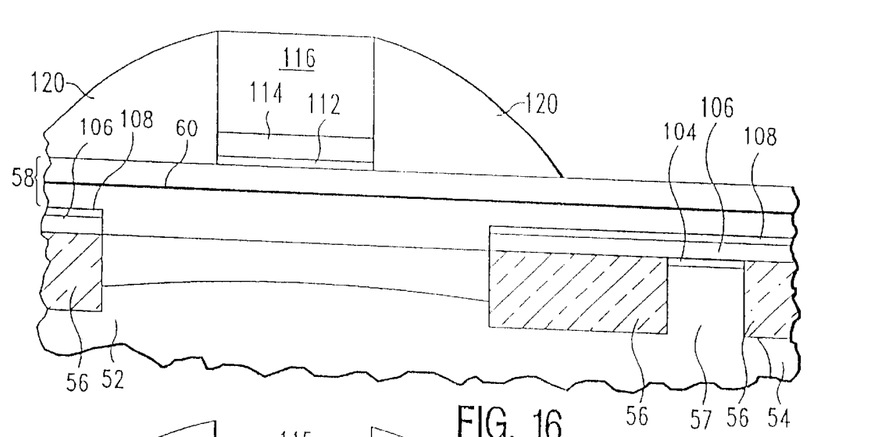

FIG. 16 shows the structure after a RIE process has been performed to form wide superspacers 120. The RIE process employed in this step of the present invention is designed to be selective to polysilicon over oxide.

Figure 17:
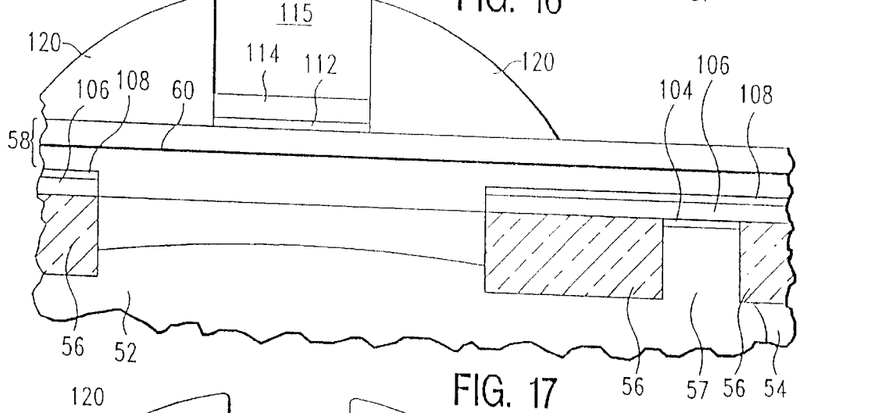
Figure 18:
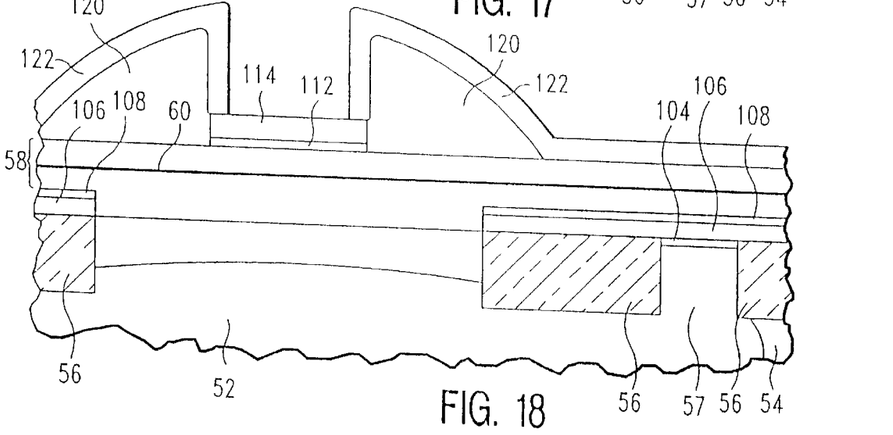

In FIG. 17, TEOS layer 116 is selectively etched stopping on nitride layer 114 by utilizing a conventional wet etch process forming trench 115 in the structure. FIG. 18 shows the structure after a layer of oxide 122 having a thickness of from about 700 to about 1000 Å has been formed over the P+ polysilicon layer. This oxide layer is typically formed by utilizing a high pressure oxidation process.

Figure 19:
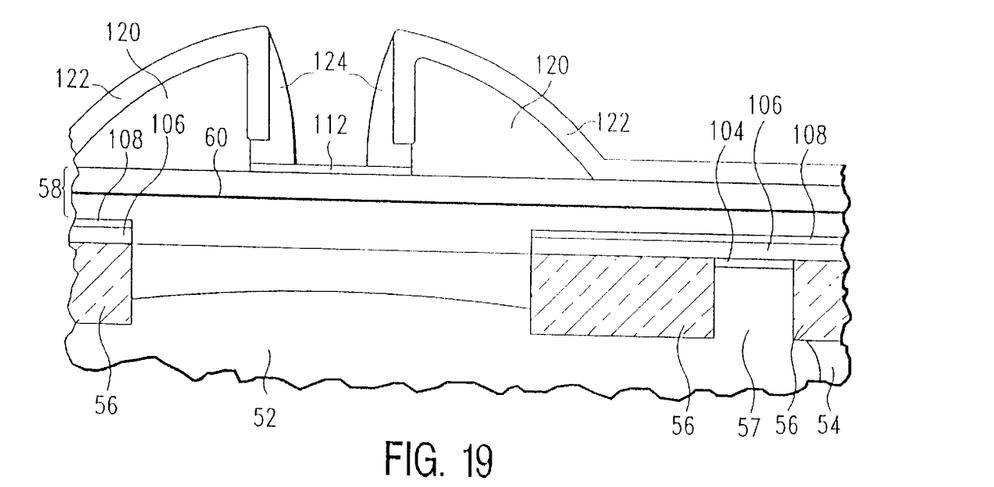

FIG. 19 shows the structure after depositing silicon nitride layer 124 and etching this silicon nitride layer by a spacer RIE process selective to oxide to form nitride spacers 124 on the structure. It should be noted that during this step of the second method of the present invention the silicon nitride present in the bottom of the trench is removed.

Figure 20:
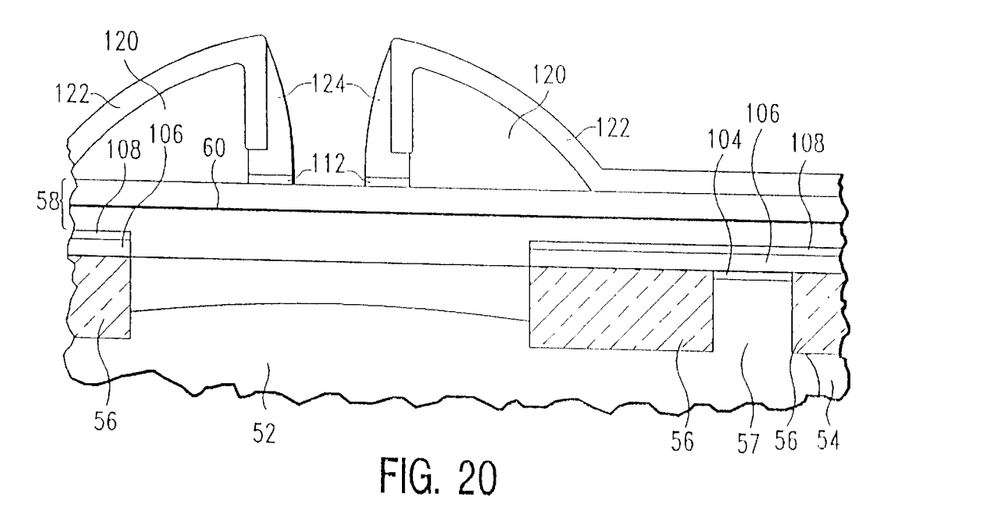
Figure 21:
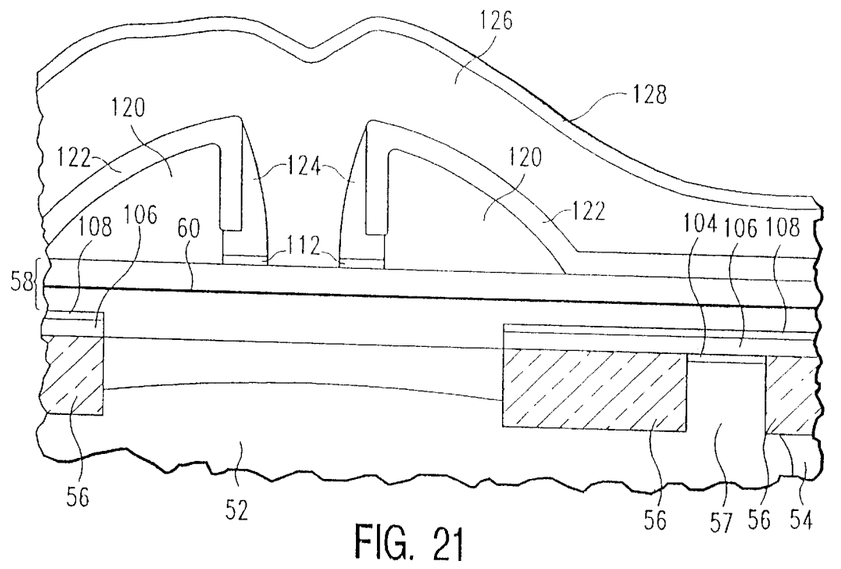

Next, oxide layer 112 in the bottom of trench 115 is removed utilizing a conventional wet etch process without completely removing the oxide grown in FIG. 18 providing the structure shown in FIG. 20. FIG. 21 shows the structure after a thick layer (on the order of 1500 Å or greater) of N+ (As) doped polysilicon 126 has been deposited followed by the formation of a thin silicon nitride cap layer 128.

Figure 22:
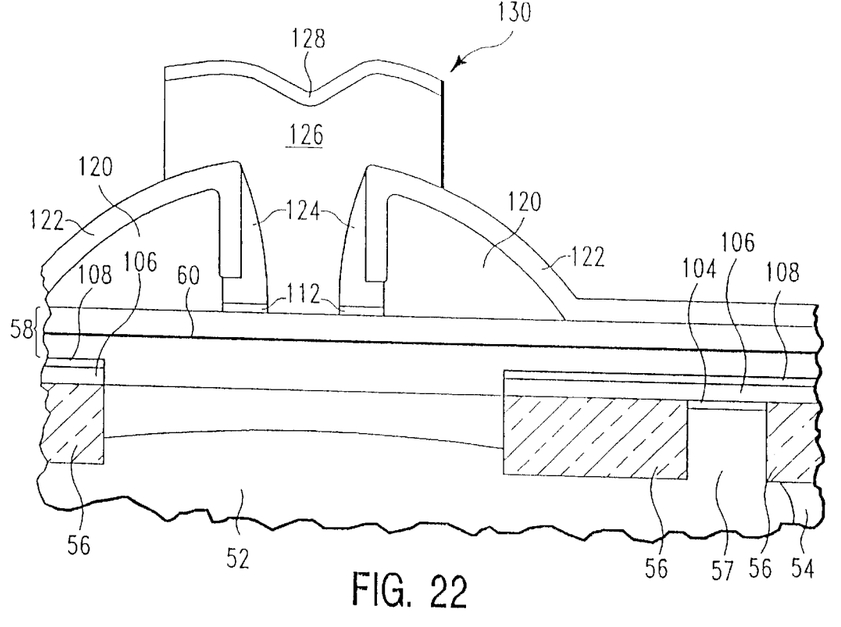

As shown in FIG. 22, emitter 130 is now formed by etching portions of the silicon nitride cap and the N+ doped polysilicon layer formed in FIG. 21. The etching step used in the step of the invention is selective for the above materials and it stops on the oxide layer grown in FIG. 18.

Figure 23:
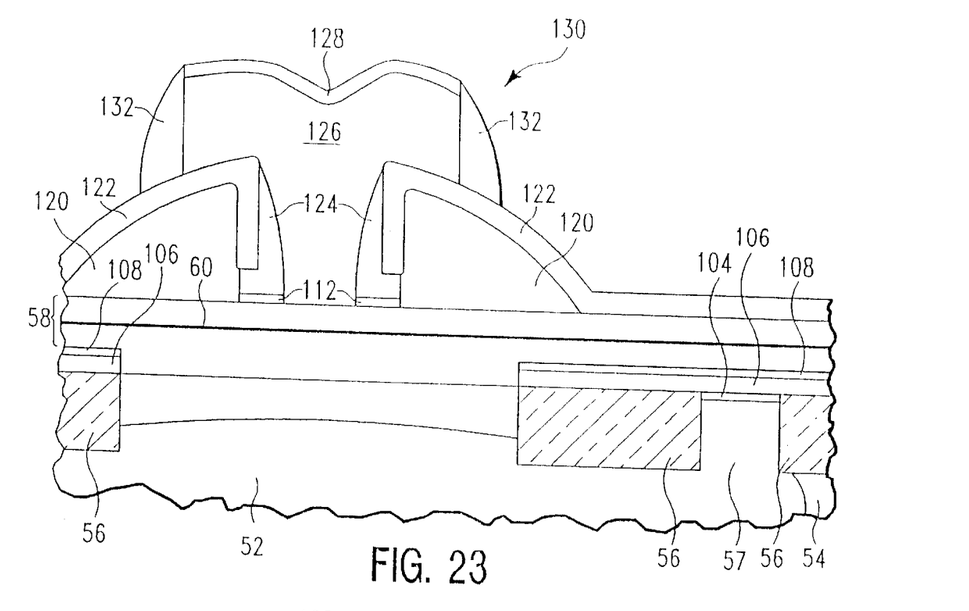

Following the formation of emitter region 130, a layer of silicon nitride having a thickness of about 200 to about 500 Å is deposited by conventional means and a RIE process selective to oxide is performed to produce nitride spacers 132 on the exposed surface of the emitter region. The above steps are illustrated in FIG. 23.

Figure 24:
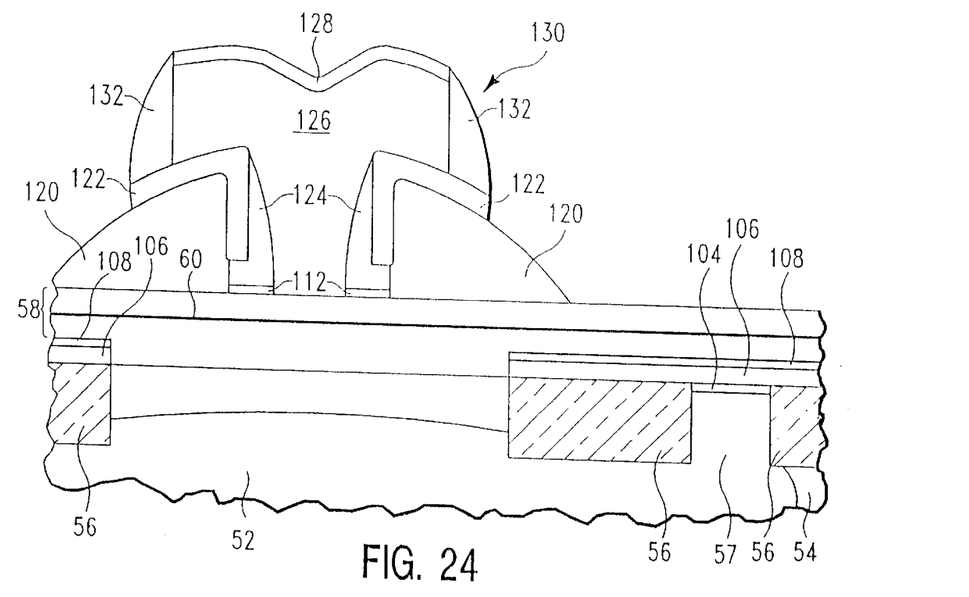
Figure 25:
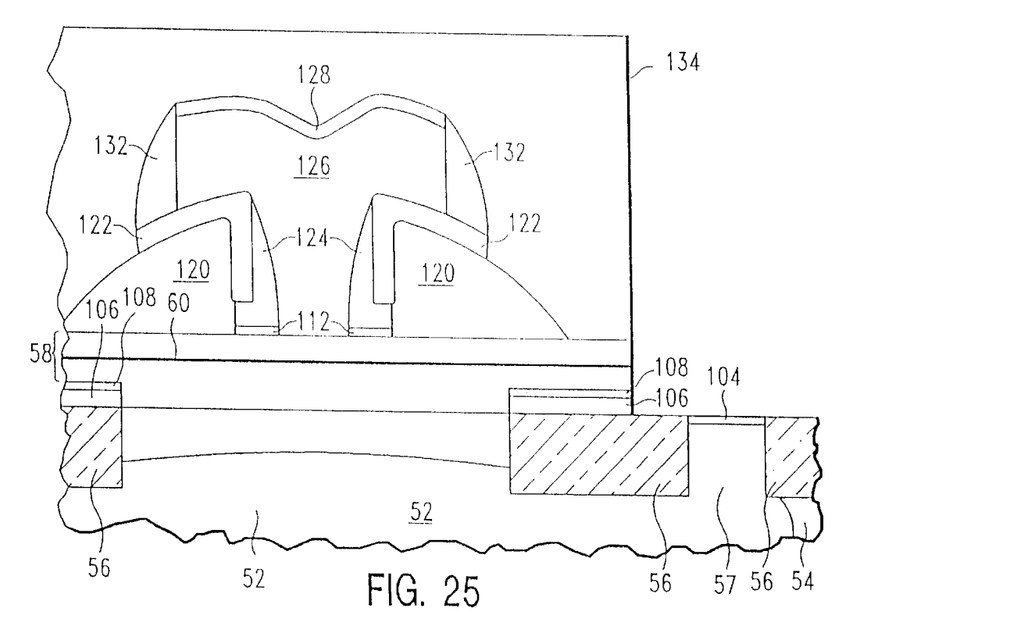

FIG. 24, shows the structure after a portion of oxide layer 122 has been removed therefrom utilizing a conventional etching process such as RIE. Next, as shown in FIG. 25, photoresist is deposited and patterned by lithography providing patterned photoresist 134. A RIE process is thereafter employed to define the extrinsic base region. This is followed by a rapid thermal anneal process which is capable of forming the emitter base and driving down the emitter.

Figure 26:
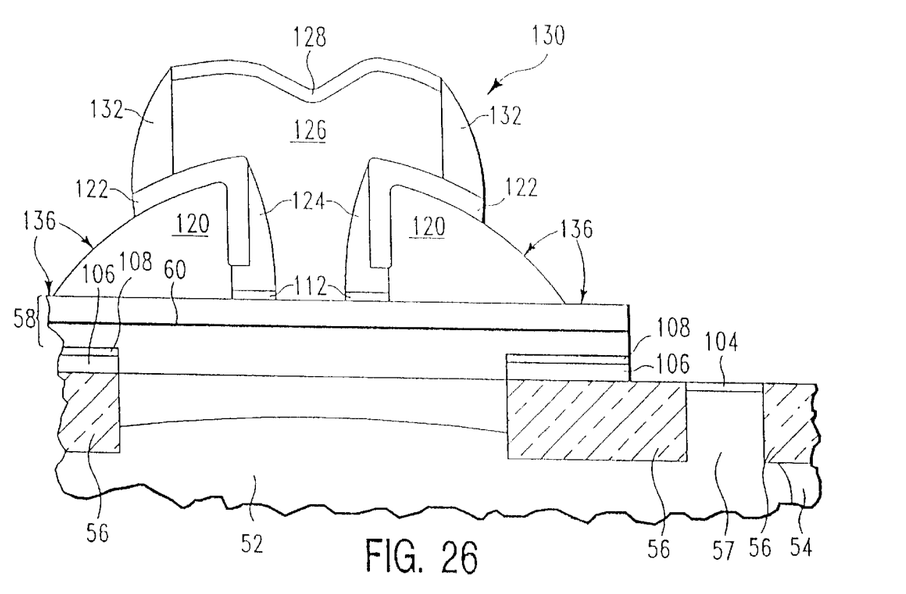

FIG. 26 shows the structure after a conventional silicide process is employed so as to form silicide regions 136 in the structure.

It is emphasized that the bipolar structures of the present invention, regardless of which method is used in fabricating the same, have a lower collector base capacitance than previous prior art structures and a higher $f_t$ as the pedestal may be doped higher; therefore higher $f_{max}$ may be achieved.

The present invention also provides a bipolar junction transistor which has resistance/capacitance control built therein. Specifically, the inventive bipolar junction transistor includes a bipolar junction transistor comprising a self-aligned base/emitter structure wherein a base-resistance is independently controlled by a diffusion source of variable thickness, and wherein the base-capacitance is independently variable due to the combination of the thickness of the diffusion source and a thickness of an intrinsic base epitaxial layer.

The extrinsic base-collector capacitance (shown schematically as capacitors in FIG. 3) between the p+ diffusion source (72 in FIG. 11) and the selectively implanted collector (68 in FIG. 3) can be modulated by either thickening the epitaxial base region (layer 58 in FIG. 3) or by shallowing the diffusion of p+ dopants from the p+ diffusion source. Since the inventors have independent control of these two variables, the inventors can reduce the base-collector capacitance to increase device performance.

In most prior or SiGe process flows, the thickness of the epitaxial base region is limited by other process constraints (such as selective epitaxy) that do not allow the ability to modulate the base-collector capacitance as in this disclosure.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A method for fabricating an epitaxial base bipolar transistor having a raised extrinsic base comprising the steps of:

(a) growing a base layer comprising at least an epitaxial single crystal layer on a single crystal semiconductor substrate;

(b) forming a mandrel on said epitaxial single crystal layer;

(c) forming a doped polysilicon layer over the mandrel and forming superspacers from said doped polysilicon layer, said superspacers serving as a raised extrinsic base;

(d) removing the mandrel to form a trench;

(e) forming a raised emitter on a surface of said epitaxial single crystal layer in the trench, said raised emitter including insulating material formed on at least sidewalls thereof, said insulating material electrically isolating said raised extrinsic base from said raised emitter; and (f) diffusing dopant from the raised emitter and said raised extrinsic base so as to provide an emitter diffusion and an extrinsic base diffusion in portions of the epitaxial single crystal layer.

2. The method of claim 1 wherein a polysilicon layer is also formed during step (a), said polysilicon layer being formed adjacent to said epitaxial single crystal layer.

3. The method of claim 2 wherein said polysilicon layer is formed over isolation regions formed in said substrate.

4. The method of claim 1 wherein said doped polysilicon layer comprises an in-situ doped P+ polysilicon.

5. The method of claim 1 wherein said raised emitter is formed by the steps of: forming an oxide layer on exposed sidewalls of said trench; forming silicon nitride spacers on said oxide layer in said trench; depositing N+ doped polysilicon and a nitride layer over the entire structure; and patterning said N+ doped polysilicon and said nitride layer so as to form said raised emitter.

6. The method of claim 1 wherein said diffusing step is conducted utilizing a rapid thermal annealing process.

7. The method of claim 6 wherein said rapid thermal annealing process is carried out in an inert gas at a temperature of from about 850° C. or above for a time period of about 30 seconds or less.

8. The method of claim 1 wherein said raised emitter and said raised extrinsic base have a height difference that is less than 20% of said emitter junction depth.

9. The method of claim 1 wherein said epitaxial single crystal layer further includes a Ge layer formed in the surface thereof.

10. The method of claim 1 wherein said semiconductor substrate includes a pedastal region.

11. The method of claim 10 wherein said emitter diffusion has an emitter diffusion junction depth, and said extrinsic base diffusion does not overlap with said pedastal region or said emitter diffusion.

12. The method of claim 1 wherein said mandrel is formed by the steps of:

(b1) forming a dielectric layer; and (b2) patterning and etching the dielectric layer.

13. The method of claim 12 wherein the dielectric layer includes layers of oxide, nitride and TEOS.

* * * * *